(12) United States Patent
Sim

(10) Patent No.: US 6,240,537 B1
(45) Date of Patent: May 29, 2001

(54) SIGNATURE COMPRESSION CIRCUIT AND METHOD

(75) Inventor: Gyoo-Chan Sim, Kyunggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/148,963

(22) Filed: Sep. 8, 1998

(30) Foreign Application Priority Data

Sep. 8, 1997 (KR) .................................................. 97-46197

(51) Int. Cl.[7] .................................................. G01R 31/28
(52) U.S. Cl. .......................................................... 714/732
(58) Field of Search .................................. 714/724, 726, 714/732, 728, 738, 733

(56) References Cited

U.S. PATENT DOCUMENTS

| | | | |
|---|---|---|---|
| 4,320,509 | * 3/1982 | Davidson | 714/736 |
| 4,503,537 | * 3/1985 | McAnney | 714/728 |
| 4,513,418 | * 4/1985 | Bardell, Jr. et al. | 714/726 |
| 4,864,570 | * 9/1989 | Savaglio et al. | 714/732 |
| 5,051,996 | * 9/1991 | Bergeson et al. | 714/732 |
| 5,572,536 | * 11/1996 | Thiruvengadam | 714/732 |
| 5,701,308 | * 12/1997 | Attaway et al. | 714/740 |
| 5,954,830 | * 9/1999 | Ternullo, Jr. | 714/718 |

OTHER PUBLICATIONS

IBM Technical Disclosure Bulletin, vol. 27, Issue No. 3, p. 1488–1489, Aug. 1984.*
Van de Goor, A.J., "Testing Semiconductor Memories Theory and Practice," Wiley Publishers, pp. 204–209, 1991.

* cited by examiner

*Primary Examiner*—Albert Decady
*Assistant Examiner*—Shelly A Chase
(74) *Attorney, Agent, or Firm*—Myers Bigel Sibley & Sajovec

(57) ABSTRACT

A parallel signature compression circuit allows the error effect of at least one of two repetitive error patterns to be transferred to a cell other than the cell where the error effect is counterbalanced. In an embodiment, a signature pattern from a circuit to be tested is latched, and then the latched pattern is compressed two or more times until a next signature pattern is outputted from the circuit to be test. The compression is performed by shifting the latched pattern serially by use of a multiple input signature register.

17 Claims, 5 Drawing Sheets

SIGNATURE COMPRESSION CIRCUIT AND METHOD

FIELD OF THE INVENTION

The present invention relates to a signature analyzer circuit for fault detection in electronic circuits, and more particularly to a signature compression circuit that latches test outputs from an electronic circuit under test and compresses them in parallel and to a signature compression method.

BACKGROUND OF THE INVENTION

U.S. Pat. No. 5,051,996 issued to Bergeson et al. on Sep. 24, 1991 teaches the overall test methodology of testing semiconductor integrated circuit devices, all of whose disclosures are incorporated herein by reference. If component level isolation of fault is desired, the serial signature technique is appropriate. However, if all that are required is fault detection, the parallel technique is the appropriate choice.

In signature analysis, either the parallel or serial signature analyzer is utilized. For signature compression, a multiple input signature register (MISR) is incorporated in the parallel signature analyzer (PSA) while a single input signature register (SISR) is incorporated in the serial signature analyzer (SSA). Considering signature analyzer area, the parallel compression technique utilizing the MISR is more profitable than the serial compression technique utilizing the SISR; the former requires only one MISR but the latter requires a plurality of SISRs. Therefore, recently, the parallel signature compression method is widely used for effectively analyzing signatures.

FIG. 1 is a view schematically illustrating a parallel signature compression technique, which is usually employed to analyze high speed semiconductor integrated circuits. As shown in FIG. 1, a semiconductor integrated circuit 10, such as a microprocessor, a RAM (random access memory), a ROM (read only memory), or a PLA (programmable logic array), is tested. A test input pattern is given to the circuit under test 10 which provides test outputs (i.e., response data) to a compression circuit 12 (i.e., MISR). The test outputs are compressed in the compression circuit 12 in parallel. At the end of the test, a signature (resultant data) of the test is stored in the compression circuit 12. A signature of the test which is generated by compressing the test outputs is read out of the compression circuit 12, and then the externally read contents are compared with expected values. Based on the comparison, the integrated circuit 10 is analyzed.

As described in "Testing Semiconductor Memories", by John Wiley & Sons, 1991, pp.204–209, the signature generated by compressing a test output pattern with errors can be identical with the signature generated by compressing a test output pattern with no error. Namely, there can take place a masking of the signature obtained by compressing the erroneous pattern. The term "masking" defines that an erroneous test output pattern maps into the same signature as the good test outputs.

If the length of the pattern sequences outputted from the circuit under test is longer than the bit length n of the signature register and if respective patterns have the same error generation probability, it is generally known in the art that the probability of masking is ½". However, since the above assumption is impracticable, it is required to pay more attention to applying the probability, depending on applications.

The MISR can be implemented in a software or hardware form. In particular, the hardware MISR is a major component of the built-in self test circuit for VLSI logics and memories.

FIG. 2 illustrates a typical MISR for compressing the response data of a circuit under test in parallel. As seen in the figure, MISR 20 includes 6 flip-flop circuits (hereinafter referred to as F-F circuits) 21-1, 21-2, . . . , and 21-6 corresponding to a 6-bit test output pattern P1-P6, respectively. Each F-F circuit 21-i is coupled to the next F-F circuit 21-(i+1) on the upper bit side via an exclusive OR (XOR) gate 23-i, where i=1, 2, . . . , or 6. One XOR gate 23-i and one F-F circuit 21-i constitute a cell. The MISR 20 further includes a feedback tap 25. This tap 25 is coupled to an input of XOR gate 27 whose the other input is coupled to the output of the F-F circuit 21-5. The output of the XOR gate 27 is applied to an input of XOR gate 23-1 in the lowest bit position.

Another structure of MISR is illustrated in FIG. 3. MISR 30 has the same circuit construction as the MISR 20 of FIG. 2, except for having a different feedback tap.

In MISR, if there are errors repetitively on the pattern sequence from a circuit under test, i.e., if MISR is used in compressing the repetitive error patterns, masking can take place. The term "repetitive error patterns" means that in two arbitrary patterns on the pattern sequence, errors are generated at the same interval as the distance between the two patterns. The repetitive error patterns have an odd-numbered distance or even-numbered distance according to the distance between the two patterns.

Repetitive error patterns with distance of 3 and repetitive error patterns with distance 4 are shown in Tables 1 and 2, respectively.

TABLE 1

| | Bit Position | | | | | |
|---|---|---|---|---|---|---|
| | P1 | P2 | P3 | P4 | P5 | P6 |
| Pattern Sequence | 1 | 0 | 0 | 0 | 0 | 0 |
| | 0 | 0 | 0 | 0 | 0 | 0 |
| | 0 | 0 | 0 | 0 | 0 | 0 |
| | 0 | 0 | 0 | 1 | 0 | 0 |

TABLE 2

| | Bit Position | | | | | |
|---|---|---|---|---|---|---|
| | P1 | P2 | P3 | P4 | P5 | P6 |
| Pattern Sequence | 1 | 0 | 0 | 0 | 0 | 0 |
| | 0 | 0 | 0 | 0 | 0 | 0 |
| | 0 | 0 | 0 | 0 | 0 | 0 |
| | 0 | 0 | 0 | 0 | 0 | 0 |
| | 0 | 0 | 0 | 0 | 1 | 0 |

In the Tables 1 and 2, each row represents a test output pattern. In each pattern, a good data bit is represented by "0" and an erroneous data bit by "1".

In Table 1, after an error appears in the first bit position P1 of the first error pattern of "100000", a repetitive error happens in the fourth bit position of the second error patter of "000100". Namely, the interval between the erroneous bit P1 of the first error pattern 100000 and the erroneous bit P4 of the second error pattern 000100 is equal to the instance between the first and second patterns (i.e., 3). Like this, in Table 2, the interval between the erroneous bit P1 of the first error pattern 100000 and the erroneous bit P5 of the second error pattern 000010 is equal to the instance between the first and second patterns (i.e., 4).

Table 3 shows the resultant data (i.e., signature) obtained by compressing the repetitive error patterns of Table 1 by means of the MISR 20 of FIG. 2.

TABLE 3

| | | Signature | | | |
|---|---|---|---|---|---|
| S1 | S2 | S3 | S4 | S5 | S6 |
| 1 | 0 | 0 | 0 | 0 | 0 |
| 0 | 1 | 0 | 0 | 0 | 0 |
| 0 | 0 | 1 | 0 | 0 | 0 |
| 0 | 0 | 0 | 0 | 0 | 0 |

As shown in Table 3, during the compression of first through third patterns, the erroneous bit P1 of the first error pattern 100000 in Table 1 is shifted twice. However, during the compression of the second error pattern 000100, it can be seen that the error effect is not propagated to the fourth F-F circuit 21-4 of FIG. 2. Namely, when the second error pattern 000100 is inputted to the MISR 20, its fourth signature bit S4 is "0". This means that the masking occurs. As a result, neither of error effects of the two error patterns is transferred to the signature Sout.

Table 4 shows the signature obtained by compressing the repetitive error patterns of Table 2 by means of the MISR 20 of FIG. 2.

TABLE 4

| | | Signature | | | |
|---|---|---|---|---|---|
| S1 | S2 | S3 | S4 | S5 | S6 |
| 1 | 0 | 0 | 0 | 0 | 0 |
| 0 | 1 | 0 | 0 | 0 | 0 |
| 0 | 0 | 1 | 0 | 0 | 0 |
| 0 | 0 | 0 | 1 | 0 | 0 |
| 0 | 0 | 0 | 0 | 0 | 0 |

As seen in Table 4, during the compression of first through fourth patterns, the erroneous bit P1 of the first error pattern 100000 in Table 1 is shifted three times. Also, during the compression of the second error pattern 000010, the error effect is not propagated to the fourth F-F circuit 21-5 of FIG. 2, so that the fifth signature bit S5 is "0". Due to this masking, neither of error effects of the two error patterns is also transferred to the signature Sout.

The above described repetitive error patterns may be easily found during memory fault detection. Therefore, it is required to consider the repetitive error patterns as an important input class of the MISRs used in testing integrated circuit memories.

SUMMARY OF THE INVENTION

It is an object of the present invention to provide a parallel signature compression register circuit with an improved error masking probability.

It is another object of the present invention to provide a method of compressing signatures from a circuit to be tested.

These and other objects and features of the present invention are provided by a digital data compression circuit for compressing response data from an electronic circuit under test. The signature compression circuit allows the error effect of at least one of two repetitive error patterns to be transferred to a cell other than the cell where the error effect is counterbalanced.

According to an aspect of the present invention, a signature pattern from a circuit to be tested is latched, and then the latched pattern is compressed two or more times until the next signature pattern is outputted from the circuit to be test. The compression is performed by shifting the latched pattern serially by use of a multiple input signature register.

According to another aspect of the invention, a preferred signature compression circuit comprises a clock generator which generates a clock signal of a frequency that is at least twice as high as an response data output frequency, and a digital data compressor which compresses the response data in synchronism with the clock signal. The digital data compressor includes a multiple input signature register which compresses the response data in parallel in synchronism with the clock signal. The multiple input signature register includes at least one feedback tap. The digital data compressor can be embedded in a single integrated circuit chip together with an electronic circuit to be tested. Alternatively, the clock generator and the digital data compressor are embedded in a single integrated circuit chip together with the electronic circuit to be tested. In addition, the compression circuit includes a buffer which latches the response data from the circuit to be tested at the response data output frequency. All of the buffer, clock generator, digital data compressor can be embedded in a single integrated circuit chip together with the electronic circuit to be tested.

According to another aspect of the invention, a test data compression circuit for compressing response data from an electronic circuit to be tested is provided. The test data compression circuit includes a signal generator which generates a first signal of a first frequency, a frequency multiplier which is responsive to the first signal and generates a second signal of a second frequency that is an integer multiple of the first frequency, and a compressor which compresses the response data at least two times in synchronism with the second signal. The compressor includes a multiple input signature register (MISR) which compresses the response data in parallel in synchronism with the second signal. The MISR includes at least one feedback tap. The frequency multiplier is formed of one of a frequency doubler, a frequency tripler, and frequency quadrupler.

According to the compression circuits and method of the invention, the error effect of at least one of two repetitive error patterns is transferred to a cell other than the cell where the error effect is counterbalanced, so that the error masking probability of the repetitive error patterns can be reduced.

BRIEF DESCRIPTION OF THE DRAWINGS

A further appreciation of the several aspects of the present invention will be gained by considering the following detailed description of preferred embodiments in conjunction with accompanying drawings wherein.

DETAILED DESCRIPTION OF THE PREFERRED EMBODIMENTS

Preferred embodiments of the present invention will now be described with reference to the accompanying drawings.

Figure 1:
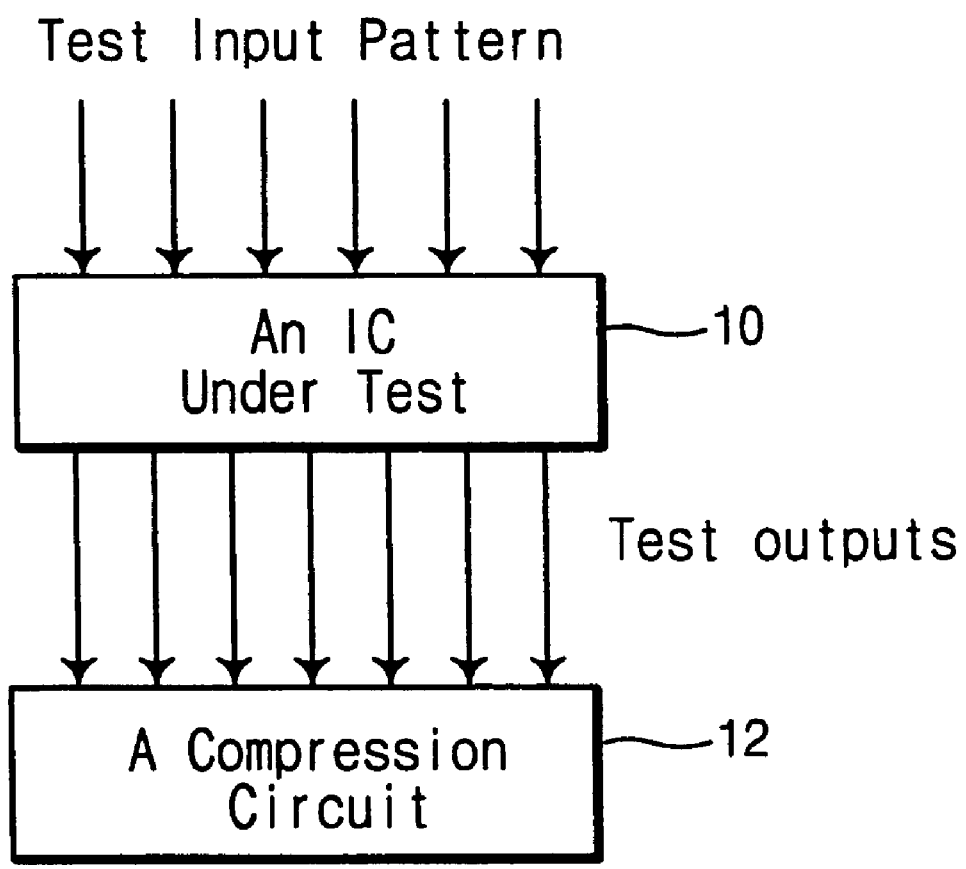
FIG. 1 is a view for schematically explaining a fault test of an integrated circuit.
Figure 2:
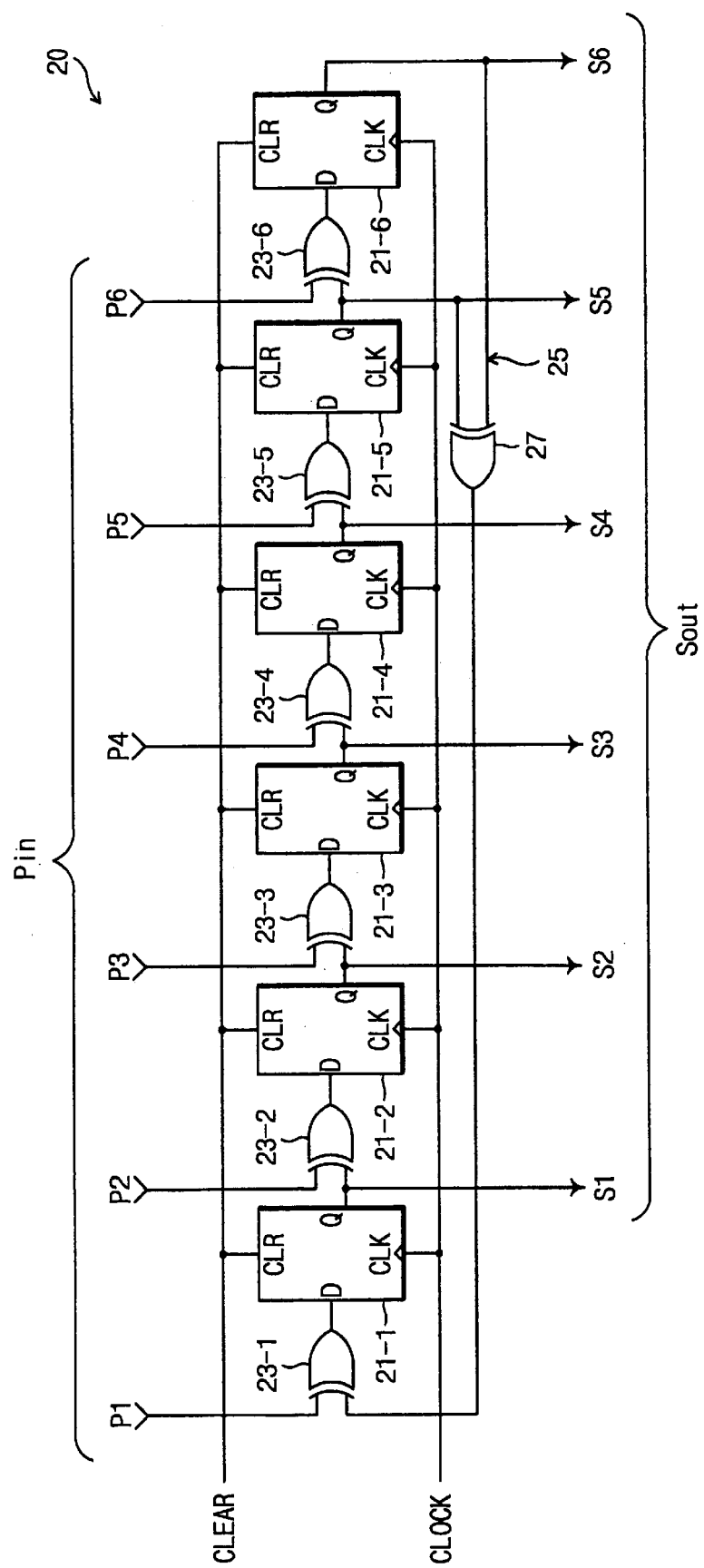
FIG. 2 is a circuit diagram illustrating a conventional parallel signature compression circuit.
Figure 3:
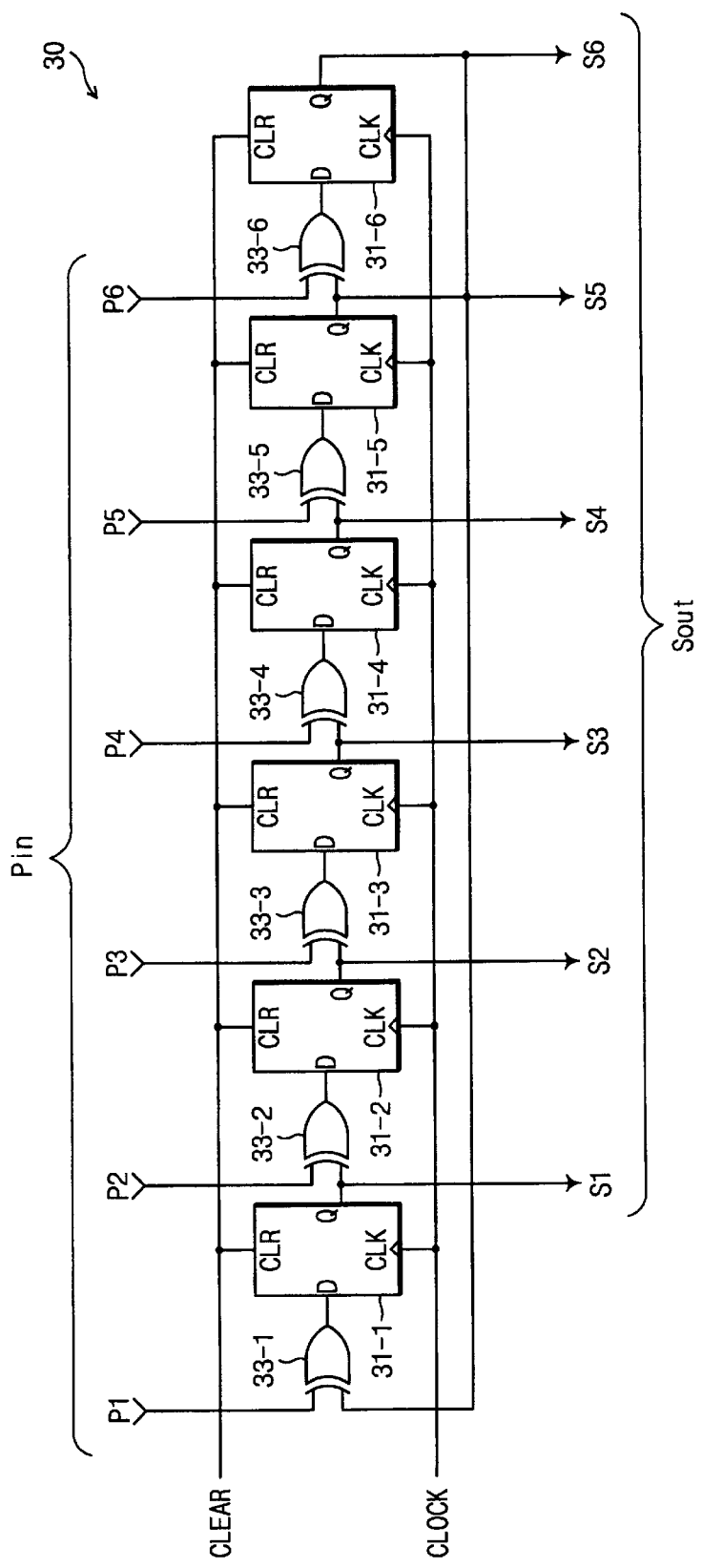
FIG. 3 is a circuit diagram illustrating another conventional parallel signature compression circuit.
Figure 4:
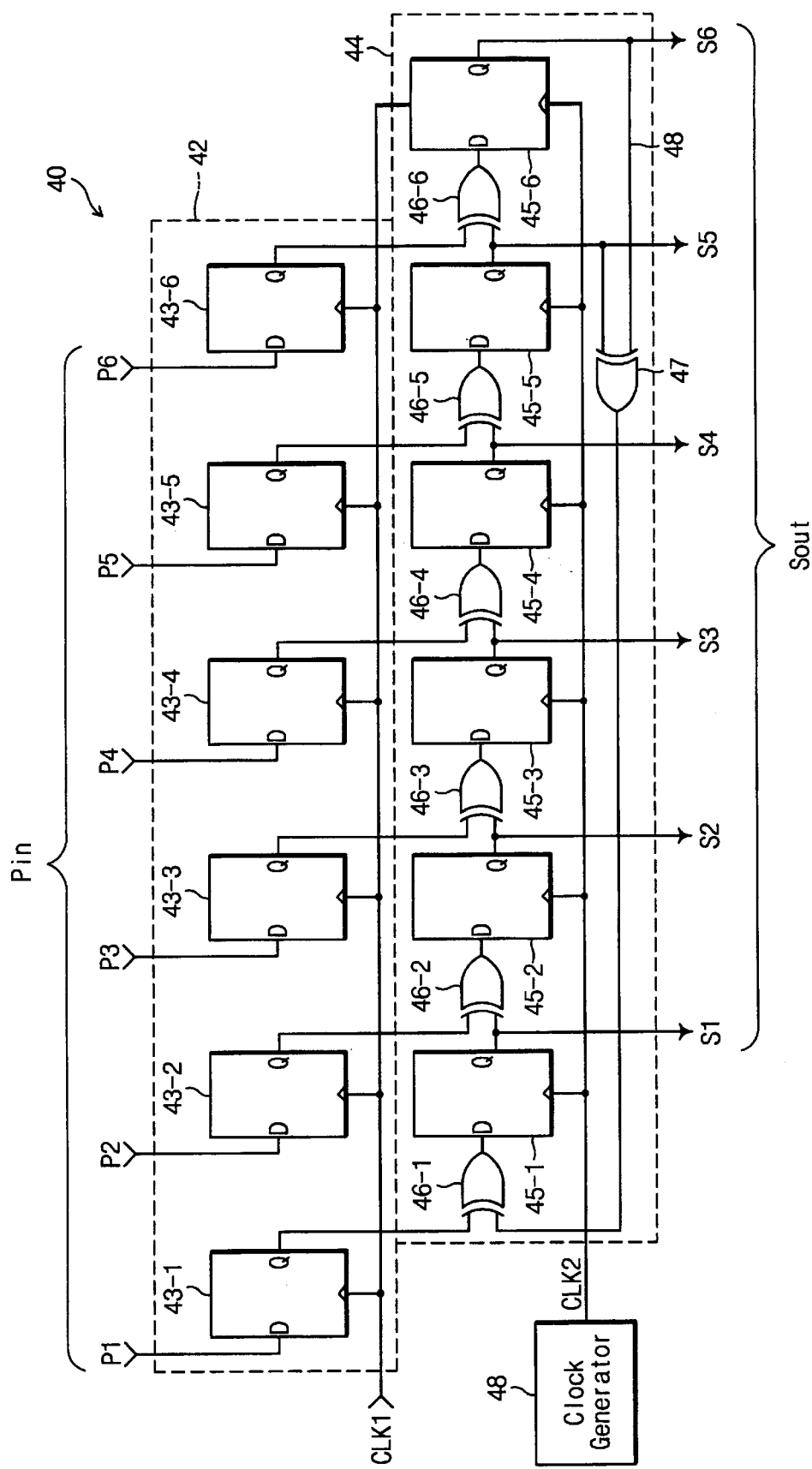
FIG. 4 is a circuit diagram illustrating an embodiment of a parallel signature compression circuit according to the present invention.
Figure 5:
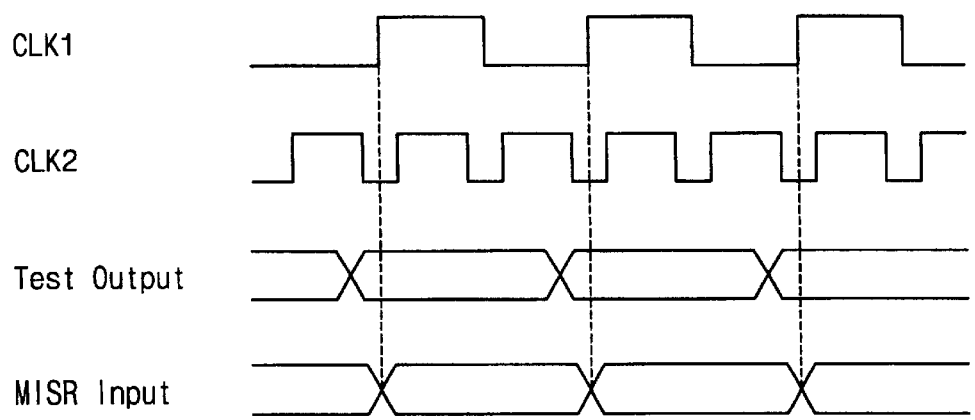
FIG. 5 is a timing diagram illustrating the timing relationship between the signals on the parallel signature compression circuit of FIG. 4.

FIG. 4 illustrates a preferred embodiment of a parallel signature compression circuit according to the present invention, and FIG. 5 illustrates the timing relationship between the signals on the parallel signature compression circuit of FIG. 4. Although, for simplicity, 6-bit MISRs (multiple input signature registers) are used in this embodiment, the ability for finding out faults in a circuit under test increases with progression of the bit number that the compression circuit has. It is practical to employ 32-bit registers.

Referring to FIGS. 4 and 5, a digital data compression circuit to compressing digital response data (i.e., signature) from an electronic circuit under test allows the error effect of at least one of two repetitive error patterns to be transferred to a cell other than the cell where the error effect is counterbalanced. A signature pattern from a circuit to be tested is compressed twice until the next signature pattern is outputted from the circuit to be test, so that the first and last error effects of the repetitive error patterns can be transferred to the last signature pattern.

As shown in FIG. 4, the signature compression circuit 40 includes a data buffer 42, a data compressor 44, and a clock generator 48. The data buffer 42 consists of 6 F-F (flip-flop) circuits 43-1, 43-2, . . . , and 43-6 which correspond to 6 response data pattern bits P1, P2, . . . , and P6 outputted from a electronic circuit to be tested, respectively. The F-F circuits 43-1, 43-2, . . . , and 43-6 latch the pattern bits P1, P2, . . . , and P6 in synchronism with a first clock signal CLK1 of a first frequency. The data compressor 44 is composed of a MISR (multiple input signature register) having 6 F-F circuits 46-1, 46-2, . . . , and 46-6, and 7 exclusive OR (XOR) gates 45-1, 45-2, . . . , 45-6, and 47. Each F-F circuit 46-i is coupled to the next F-F circuit 46-(i+1) on the upper bit side via a corresponding XOR gate 45-(i+1), where i =1, 2, . . . , or 6. Each F-F circuit 46-i has an input D, an output Q, a clear control input CLR, and a clock input CLK. The F-F circuits 45-1, 45-2, . . . , and 45-6 are supplied with a second clock signal CLK2 of a second frequency which is twice as high as the first frequency. An input of the XOR gate 46-i is fed with a corresponding bit of the buffer 42. In addition, the data compressor 44 has a feedback tap. This tap is coupled to an input of XOR gate 47 whose the other input is coupled to the output Q of the F-F circuit 45-5. The output of the XOR gate 47 is applied to an input of XOR gate 46-1 in the lowest bit position. The data compressor 44 compresses the latched pattern bits P1, P2, . . . , and P6 twice until the next signature pattern is outputted from a circuit under test.

The double compression is performed by shifting the latched pattern serially by means of the MISR which is clocked with the second clock signal CLK2 provided from the clock generator 48. For example, if the repetitive error patterns with distance 3 of Table 2 is compressed double, the resultant signatures different from normal signatures are obtained as shown in Table 5.

| S1 | S2 | S3 | S4 | S5 | S6 |
|----|----|----|----|----|----|
| \multicolumn{6}{c}{Signature} |

| S1 | S2 | S3 | S4 | S5 | S6 |
|----|----|----|----|----|----|
| 1 | 0 | 0 | 0 | 0 | 0 |
| 1 | 1 | 0 | 0 | 0 | 0 |
| 0 | 1 | 1 | 0 | 0 | 0 |
| 0 | 0 | 1 | 1 | 0 | 0 |
| 0 | 0 | 0 | 1 | 1 | 0 |
| 1 | 0 | 0 | 0 | 1 | 1 |
| 0 | 1 | 0 | 1 | 0 | 1 |
| 0 | 0 | 1 | 1 | 1 | 0 |

The double compression is normalized as follows.

As shown in Table 6, the repetitive error patterns, in which errors appear on the i-th bit of the first pattern and on the (i+k)-th bit of the second pattern having a distance of k from the first pattern, are considered.

TABLE 6

| Pattern | Bit Position | | | | |
|---------|---|---|---|---|---|
| Sequence | i | — | — | — | i + k |
| i | 1 | 0 | 0 | 0 | 0 |
| — | 0 | 0 | 0 | 0 | 0 |
| — | 0 | 0 | 0 | 0 | 0 |
| — | 0 | 0 | 0 | 0 | 0 |
| i + k | 0 | 0 | 0 | 0 | 1 |

When the first pattern (i.e., the first error pattern) has been compressed twice, the error effects are appears on the i-th and (i+1)-th bits of the signature. In the MISR 44, the 2-bit error effects are shifted 2(k-2) times until the last pattern (i.e., the second error pattern) is inputted to the MISR. At the completion of the double compression of the last pattern, the 2-bit error effects produced by the first error pattern is transferred to the (i+2k)-th and (i+2k+1)-th bits of the corresponding signature and those produced by the second error pattern is transferred to the (i+k)-th and (i+k+1)-th bits of the corresponding signature.

Table 7 shows the double compression process of the normalized repetitive error patterns using the MISR which has no feedback tap within bit positions i through i+2k+1.

TABLE 7

| Pattern Sequence | Signature | | | | | | | | | |
|---|---|---|---|---|---|---|---|---|---|---|
| | i | — | — | — | i+k | i+k+1 | — | — | — | — |
| i | 1 | 0 | 0 | 0 | 0 | 0 | 0 | 0 | 0 | 0 |
| | 0 | 1 | 0 | 0 | 0 | 0 | 0 | 0 | 0 | 0 |
| — | 0 | 1 | 1 | 0 | 0 | 0 | 0 | 0 | 0 | 0 |
| | 0 | 0 | 1 | 1 | 0 | 0 | 0 | 0 | 0 | 0 |
| — | 0 | 0 | 0 | 1 | 1 | 0 | 0 | 0 | 0 | 0 |
| | 0 | 0 | 0 | 0 | 1 | 1 | 0 | 0 | 0 | 0 |
| — | 0 | 0 | 0 | 0 | 0 | 1 | 1 | 0 | 0 | 0 |
| | 0 | 0 | 0 | 0 | 0 | 0 | 1 | 1 | 0 | 0 |
| i+k | 0 | 0 | 0 | 0 | 1 | 0 | 0 | 1 | 1 | 0 |
| | 0 | 0 | 0 | 0 | 1 | 1 | 0 | 0 | 1 | 1 |

When the distance between the repetitive error patterns is beyond 2, the error effects appear on four bits of the last sequence (e.g., the signature '00001 10011' of Table 7). For example, if the distance is 3 and i is equal to 1, the error effects produced by the first error pattern will appear on the 7-th and 8-th bits of the signature and those produced by the second error pattern will appear on the 4-th and 5-th bits of the signature.

In the MISR, if there is provided a feedback tap from the (i+k)-th or afterwards, the error effect passing through the cell is transferred to another cell lower than the cell in bit position, causing the error effect to appear on a lower bit position than i-th bit of the signature. In this case, the error effects are found on above four bits of signature.

The above-described double compression of the invention can prevent the error masking of the repetitive error patterns, regardless of the distances between the repetitive error patterns.

Referring again to FIG. 4, all of the buffer 42, digital data compressor 44, and clock generator 48 can be embedded in a single integrated circuit chip together with the electronic circuit to be tested, so that the chip can a BIST (built-in self test) function.

In a variation of this embodiment, a frequency multiplier can be used instead of the clock generator 48. The frequency multiplier is formed of either of a frequency doubler, a frequency tripler, and frequency quadrupler. The frequency multiplier is responsive to the first clock signal CLK1 and generates the second clock signal CLK2 of a frequency that is an integer multiple of the first clock frequency.

As described above, the signature compression circuit of the invention allows the error effect of at least one of two repetitive error patterns to be transferred to a cell other than the cell where the error effect is counterbalanced, so that the error masking of the repetitive error patterns can be prevented.

While the invention has been described in its preferred embodiments, it is to be understood that the words which have been used are words of description rather than limitation and that changes within the purview of the appended claims may be made without departing from the true scope of the invention as defined by the claims.

What is claimed is:

1. A compression circuit for generating signature patterns from response data patterns that are produced at a first frequency, said compression circuit comprising:

a clock generator circuit that generates a clock signal having a second frequency at least twice as great as the first frequency; and a digital data compressor circuit that compresses the response data patterns in synchronism with the clock signal such that a respective one of the response data patterns is compressed at least two times to produce a respective signature pattern.

2. The compression circuit of claim 1, wherein said digital data compressor circuit comprises a multiple input signature register which compresses the response data patterns in synchronism with the clock signal.

3. The compression circuit of claim 2, wherein said multiple input signature register includes at least one feedback tap.

4. The compression circuit of claim 1, wherein the response data patterns are produced by an electronic circuit, and wherein said digital data compressor is integrated in a single integrated circuit chip with said electronic circuit.

5. The compression circuit of claim 4, wherein said clock generator is included in said single integrated circuit chip.

6. The compression circuit of claim 1, further comprising a buffer circuit which latches response data at the first frequency to generate the response data patterns at the first frequency.

7. The compression circuit of claim 6, wherein the response data is produced by an electronic circuit, and wherein said buffer circuit, said clock generator circuit and said digital data compressor circuit are included in a single integrated circuit chip with said electronic circuit.

8. The compression circuit of claim 7, wherein said integrated circuit chip is a memory chip.

9. A method for generating signature patterns from response data produced by a circuit to be tested, the method comprising the steps of:

latching the response data to produce a first response data pattern;

compressing the first response data pattern two or more times to produce a first signature pattern from the first response data pattern;

latching the response data to produce a second response data pattern; and compressing the second response data pattern to produce a second signature pattern.

10. The method of claim 9:

wherein said step of latching the response data to produce a first response data pattern comprises the step of applying the first response data pattern to a multiple input shift register (MISR);

wherein said step of compressing the first response data pattern comprises the step of clocking the MISR at least two times while the first response data pattern is applied to the MISR to generate the first signature pattern; and wherein said step of latching the response data to produce a second response data pattern comprises the step of applying the second response data pattern to the MISR.

11. A method according to claim 10, wherein the step of applying the first response data pattern to a multiple input shift register (MISR) comprises the step of applying the first response data pattern to the MISR until the second response data pattern is applied to the MISR.

12. A compression circuit for compressing response data from an electronic circuit to be tested, said compression circuit comprising:

a signal generator circuit that generates a first signal having a first frequency;

a latch circuit, responsive to the first signal, that latches the response data to produce response data patterns at the first frequency;

a frequency multiplier circuit, responsive to the first signal, that generates a second signal having a second frequency which is an integer multiple of the first frequency; and a compressor circuit, responsive to the second signal, that compresses each of the response data patterns at least two times in synchronism with the second signal to generate a respective signature pattern for a respective response data pattern.

13. The compression circuit of claim 12, wherein said compressor circuit comprises a multiple input signature register which compresses the response data patterns in synchronism with the second signal.

14. The compression circuit of claim 13, wherein said multiple input signature register includes at least one feedback tap.

15. The compression circuit of claim 12, wherein said frequency multiplier circuit comprises one of a frequency doubler, a frequency tripler, and frequency quadrupler.

16. A method of generating signature patterns from response data, the method comprising the steps of:

latching the response data to produce response data patterns at a first frequency; and compressing the response data patterns at a second frequency at least two times greater than the first frequency to produce respective signature patterns for respective ones of the response data patterns.

17. The method of claim 16:

wherein the step of latching comprises the step of applying the response data patterns to a multiple input shift register (MISR) at the first frequency; and wherein the step of compressing comprises clocking the MISR at the second frequency.

* * * * *